United States Patent
Bettella

(10) Patent No.: US 8,640,479 B2
(45) Date of Patent: Feb. 4, 2014

(54) COOLING SYSTEM FOR A ROOM CONTAINING ELECTRONIC DATA PROCESSING EQUIPMENT

(75) Inventor: Francesco Bettella, Padua (IT)

(73) Assignee: Uniflair S.p.A. (IT)

( * ) Notice: Subject to any disclaimer, the term of this patent is extended or adjusted under 35 U.S.C. 154(b) by 510 days.

(21) Appl. No.: 12/093,438

(22) PCT Filed: Nov. 13, 2006

(86) PCT No.: PCT/EP2006/068408
§ 371 (c)(1),
(2), (4) Date: Oct. 7, 2008

(87) PCT Pub. No.: WO2007/054578
PCT Pub. Date: May 18, 2007

(65) Prior Publication Data
US 2009/0293518 A1    Dec. 3, 2009

(30) Foreign Application Priority Data
Nov. 11, 2005   (LU) .......................................... 91207

(51) Int. Cl.
*F25D 23/00*   (2006.01)

(52) U.S. Cl.
USPC .......................................... 62/259.2; 62/186

(58) Field of Classification Search
USPC .......... 62/286, 259.2, 186; 454/258, 290, 233
See application file for complete search history.

(56) References Cited

U.S. PATENT DOCUMENTS

| | | | |
|---|---|---|---|
| 4,677,904 A | | 7/1987 | Natsumeda et al. |
| 4,729,292 A | * | 3/1988 | Marton .......................... 454/284 |
| 5,180,333 A | * | 1/1993 | Shyu .............................. 454/319 |
| 5,345,779 A | * | 9/1994 | Feeney .......................... 62/259.2 |
| 5,910,045 A | | 6/1999 | Aoki et al. |
| 6,283,380 B1 | | 9/2001 | Nakanishi et al. |
| 6,574,104 B2 | | 6/2003 | Patel et al. |

(Continued)

FOREIGN PATENT DOCUMENTS

| | | |
|---|---|---|
| DE | 2301693 | 7/1973 |
| JP | 04208353 | 7/1992 |
| JP | 06174260 | 6/1994 |

OTHER PUBLICATIONS

International Search Report, PCT/EP06/68408, Mar. 13, 2007.

*Primary Examiner* — Cheryl J Tyler
*Assistant Examiner* — Jonathan Bradford
(74) *Attorney, Agent, or Firm* — Cantor Colburn LLP

(57) ABSTRACT

A cooling system for a room containing electronic data processing equipment includes a raised floor construction dividing the room into a plenum space underneath the raised floor and a usable space above the raised floor, an air conditioning device for feeding cooled air to the plenum space and a cooling module. The cooling module is arranged as a floor element of the raised floor and includes a fan for providing a flow of cooled air from the plenum space to the usable space, the cooling module being configured such that the flow direction of the flow is controllable. The system further includes a control device connected to the cooling module for automatically controlling the flow direction of the flow. According to an important aspect of the invention, the cooling module includes at least one adjustable deflector unit arranged downstream of the fan for deviating the flow of cooled air provided by the fan, the deflector unit being connected to the control device for automatic adjustment of the deflector unit. A corresponding cooling module is also proposed.

19 Claims, 5 Drawing Sheets

(56) References Cited

U.S. PATENT DOCUMENTS

| | | |
|---|---|---|
| 6,694,759 B1 * | 2/2004 | Bash et al. ..................... 62/180 |
| 6,747,872 B1 | 6/2004 | Patel et al. |
| 7,214,131 B2 * | 5/2007 | Malone ......................... 454/184 |
| 2004/0109288 A1 | 6/2004 | Beitelmal et al. |
| 2005/0011208 A1 | 1/2005 | Dobbs et al. |
| 2005/0075065 A1 * | 4/2005 | Nair ............................. 454/186 |
| 2005/0241810 A1 | 11/2005 | Malone et al. |

\* cited by examiner

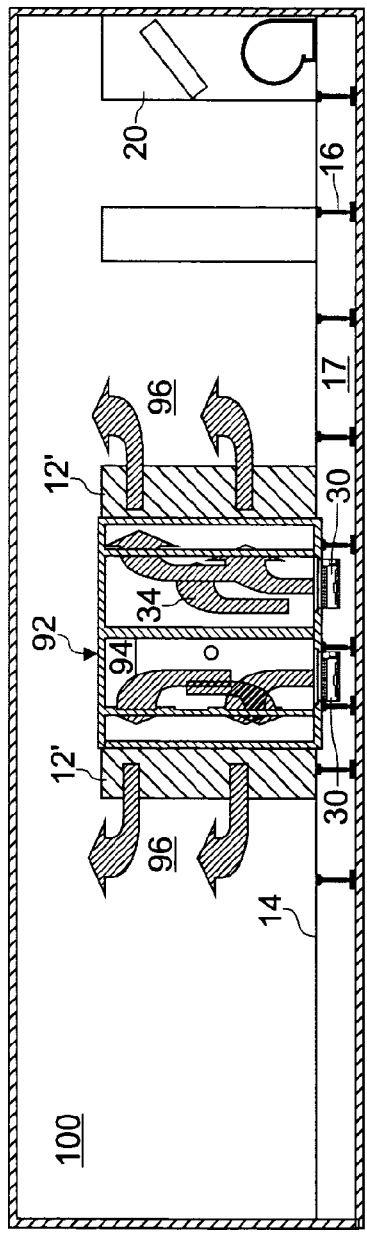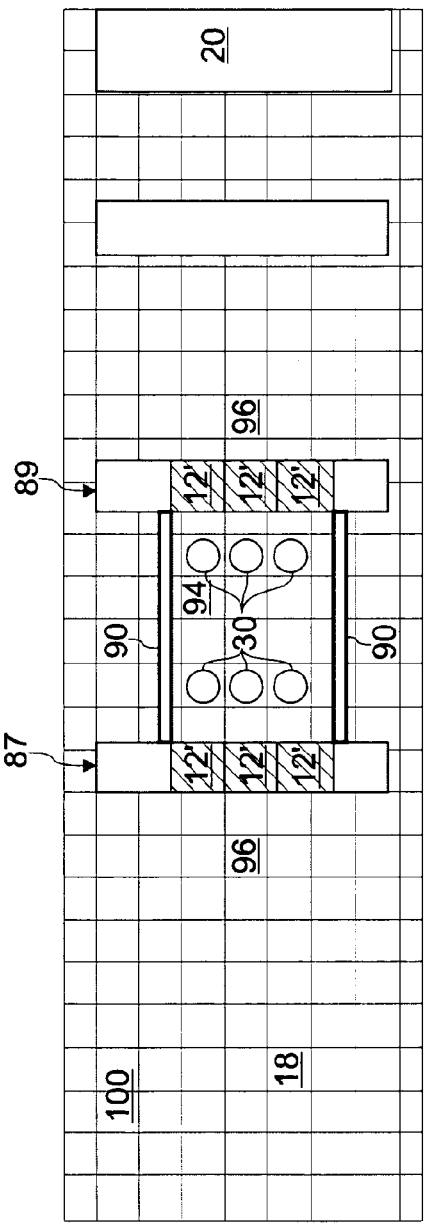
Fig. 5
Fig. 6

_US 8,640,479 B2_

COOLING SYSTEM FOR A ROOM CONTAINING ELECTRONIC DATA PROCESSING EQUIPMENT

INTRODUCTION

The present invention relates to a cooling system for a room containing electronic data processing equipment.

Electronic data processing equipment commonly installed in such rooms, often referred to as data centres, involves, for example, information technology (IT) or telecommunication equipment. The equipment is generally arranged in the form of racks each one housing a plurality of plug-in modules for processing, communication or storage of data or similar purposes.

Due to the significant increase of data processing and transmission volume experienced recently, equipment manufacturers have developed ultra-compact systems to manage this increase in volume. Because of ongoing improvements in integration of integrated circuits and the constantly rising demand in data treatment, heat dissipation per unit volume or unit surface has known a dramatic increase in recent years. This trend is assumed to continue in the future. For example, with a standard footprint size of e.g. 800×1200 mm and total heat dissipation of well above 10 kW for a typical server rack, values of heat dissipation per unit surface largely exceeding 10 kW/m$^2$ have become common today. Another tendency adding to this problem is the reduction of available floor space per equipment item, firstly due to the increase of required equipment in a given room and secondly due to the rising real estate prices especially in metropolitan areas. A market specifically concerned with this problem is the telecommunications market. Because of the so-called "convergence" phenomenon, service providers are experiencing the need to provide and manage land-based and mobile telephony services as well as computer network services jointly by means of the same data centre.

It is well known that an acceptable operating temperature is of paramount importance for reliable operation of electronic data processing equipment. For the above reasons, cooling of the rooms into which the heat produced by the equipment is dissipated and cooling of the equipment itself has become a major challenge.

Another important aspect in this context is total energy consumption of such rooms. As a general rule, dissipated heat increases with the electric power consumption of the equipment and as a result thereof the power consumption of the cooling system associated to the room increases as well. Electrical power consumption of 0.5 MW or more for the equipment in such a room is not exceptional today. Required cooling power generally amounts from one third to one half or more of the electric power consumption of the equipment. As a result, significant savings can be achieved by providing more efficient cooling systems.

Among the various known approaches for cooling, there is the so called "direct rack cooling" employing liquid coolant circuits and ventilated heat exchangers directly mounted to each rack, "displaced conditioning" employing air conditioners arranged in batteries on a side wall of the room and cooling the entire room, "top-down cooling" employing roof mounted conditioners providing cooled air to the racks from above, and "under-floor delivery cooling" employing a raised floor for distributing cold air to the racks by means of floor grilles. The first approach presents severe risks associated to liquid coolant leakage, reduced installation flexibility and considerable installation cost. The latter three approaches are generally relatively inefficient in that essentially the entire room is conditioned and in consequence the cooling infrastructure is often over-designed and excessively redundant in order to warrant sufficient cooling for each and every piece of equipment in any circumstance.

An example of an under-floor delivery cooling system is known from U.S. Pat. No. 6,694,759. In this system, a central fan or blower is used to pressurize the plenum by blowing cold air into the plenum. Instead of conventional passive vents (floor grilles) for feeding pressurized cold air from the plenum to the equipment, this system uses automatically adjustable vents. According to U.S. Pat. No. 6,694,759, such vents allow adjustment to changing thermodynamics and reduction of a problem known as air scavenging. Furthermore, they allow balancing the pressure within the plenum on a zonal basis. A further improvement of a system according to U.S. Pat. No. 6,694,759 is known from U.S. Pat. No. 6,747,872. In the system described in U.S. Pat. No. 6,747,872, a variable volume device, such as an adjustable damper, is provided between the plenum and a vent for controlling the pressure within the plenum. These systems are however not capable of selectively and variably directing the cold airflow in targeted manner, e.g. towards a specific portion of equipment that requires cooling.

In this respect, an improved solution of under-floor delivery cooling has been proposed in U.S. Pat. No. 6,283,380, which describes an air conditioning system for a room requiring cooling. The room is provided with a raised floor construction and an air conditioning device for feeding cooled air to a plenum below the raised floor. The cooling system includes a cooling device arranged as floor element of the raised floor and comprising a fan for providing a flow of cooled air from the plenum to the usable space of the room. By virtue of a movable fan that is controllable in airflow rate and airflow direction, the cooling device allows to control the flow direction of the cool airflow. This movable fan has a relatively complex construction including an inclinable shaft and an associated electromagnetic airflow direction control contrivance. A computer is connected to an airflow direction control circuit of the movable fan for controlling the flow direction in accordance with a preliminary room temperature simulation based on measured temperatures. Although the system according to U.S. Pat. No. 6,283,380 is able to provide cooling of critical areas in targeted manner, the proposed device for achieving control of the flow direction is relatively complex and hence believed to be expensive, to require relatively frequent maintenance and to be susceptible to mechanical problems and resultant downtime.

OBJECT OF THE INVENTION

In view of the above, the object of the present invention is to provide a simplified, efficient and reliable cooling system for a room containing electronic data processing equipment.

GENERAL DESCRIPTION OF THE INVENTION

In order to achieve this object, the present invention proposes a cooling system designed for a room containing electronic data processing equipment which requires cooling. This system comprises a raised floor construction dividing the room into a plenum space underneath the raised floor and a usable space above the raised floor, an air conditioning device for feeding cooled air to the plenum space and a cooling module arranged as floor element of the raised floor. The cooling module comprises a dedicated fan for providing a flow of cooled air from the plenum space to the usable space in order to cool the equipment. Furthermore, the cooling module is configured such that the airflow direction is controllable. The system further comprises a control device connected to the cooling module for automatically controlling the flow direction of the flow. According to an important aspect of the invention, the cooling module comprises at least one adjustable deflector unit arranged downstream of the fan for deviating the flow of cooled air provided by the fan, the deflector unit being connected to the control device for automatic adjustment of the deflector unit.

The deflector unit allows selectively varying the direction of cooled air outflow towards a predetermined region where cooling is required as determined by the control device. Furthermore, the deflector unit is arranged together with the fan in the cooling module for forming a compact unit. By virtue of the adjustable deflector unit, there is no need for a specialized, complex and expensive adjustable construction of the fan. Standard available fans can be used instead.

The present invention also proposes a corresponding cooling module for use in the proposed system.

While avoiding the need for a complex fan construction for achieving control of flow direction, this system enables dynamic allocation of cooling resources where and when they are needed in the room in accordance with the actual thermal load produced by the electronic data processing equipment.

The proposed cooling module with integrated fan enables considerable increases in overall airflow rate that can be achieved per "vent unit" of an under-floor delivery type cooling system. Flow rates in the order of 4'500 m³/h can be achieved with a single cooling module according to the invention, as opposed to typical flow rates of approximately 800-1000 m³/h for a passive vent unit of the same size (e.g. a single 600 mm wide square floor grille) with pressurized plenum supply from a single central blower. Typically, equipment racks (e.g. an IT server rack of 600 mm width and 2-2.4 m height) have a nominal cooling airflow rate at full load in the range of several thousands of m³/h, e.g. 4000-5000 m³/h. Hence, the active cooling module of the present invention also allows reducing the floor space required for vent units, or in other words, it increases the achievable ratio of racks per floor area.

Another known problem with known systems resides in the risk of overheating of the upper equipment items in a given rack compared to the lower items because the items arranged in the lower part may entirely "consume" the cold air, i.e. increase the latter's temperature to an inefficient value, such that items in the upper part of a given rack are exposed to the risk of overheating. The proposed cooling module allows minimizing such risk by virtue of the automatically adjustable deflector unit(s) in combination with an increased airflow rate due to the dedicated fan.

Using one or more adjustable deflector units in combination with a dedicated fan according to the invention, a higher degree of targeted cooling is possible compared to prior art systems. Safety-related overdimensioning of cooling power, as commonly encountered in passive systems, and any related waste of energy is thereby reduced or even eliminated. Furthermore, improved overall control of the room and equipment temperatures is enabled.

Further advantageous embodiments of the cooling system and cooling module are defined in the dependent claims and will become more apparent from the description hereinafter.

BRIEF DESCRIPTION OF THE FIGURES

The present invention will be more apparent from the following description of a not limiting embodiment with reference to the attached drawings, in which identical reference numerals will be used to identify identical or similar parts. In these drawings

FIG. 5: is a schematic cross-section showing several cooling modules according to FIG. 2 installed next to equipment racks according to FIG. 3 in combination with partition walls defining a cold air region and a hot air region;

FIG. 6: is a schematic plan view of the arrangement of FIG. 5.

DETAILED DESCRIPTION WITH RESPECT TO THE FIGURES

Figure 1:
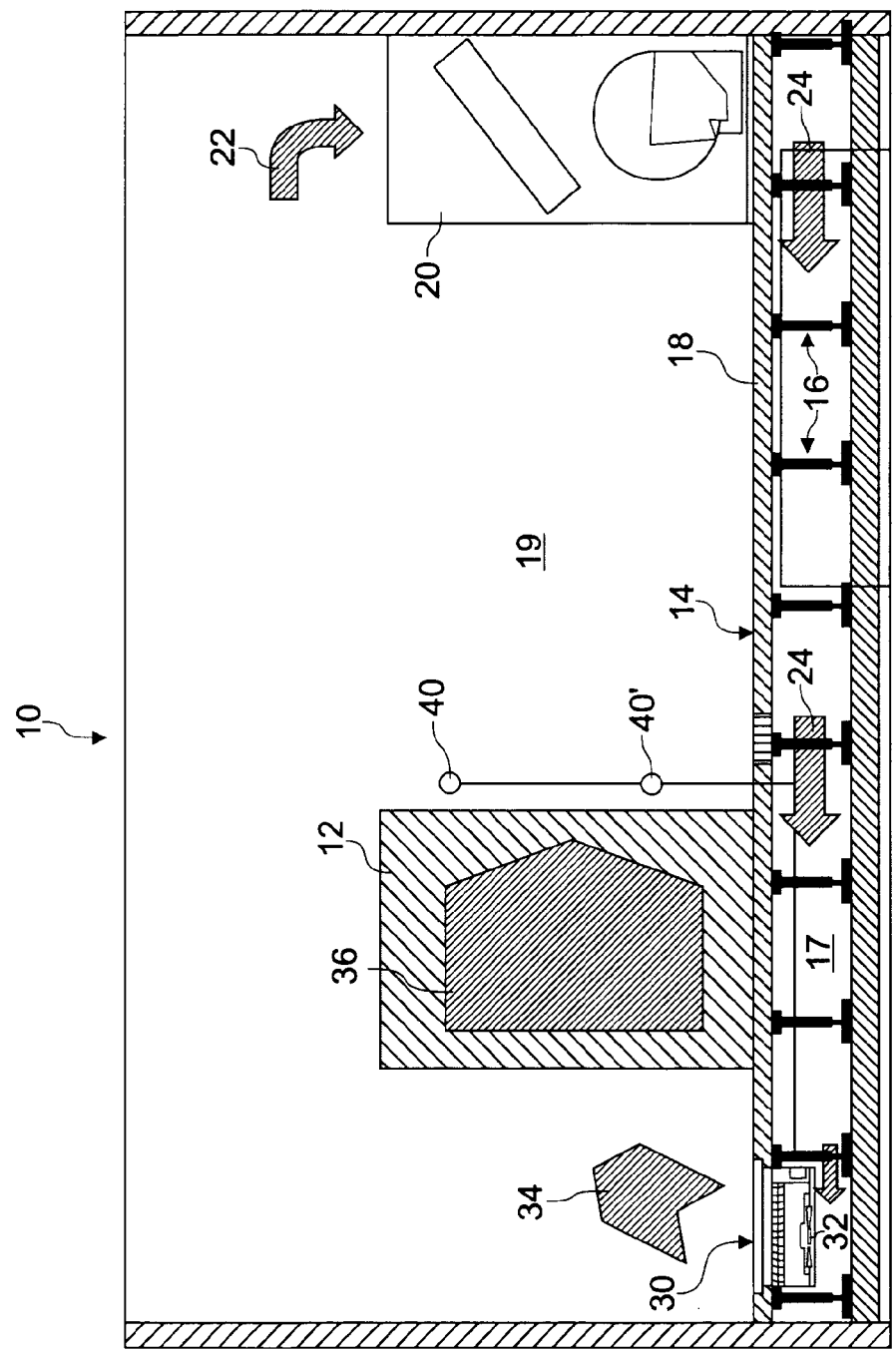
FIG. 1: is a schematic cross-section showing a room containing electronic data processing equipment and a cooling system according to the invention.

FIG. 1 schematically shows a room 10 containing electronic data processing equipment indicated at 12, for example a server rack for a computer or telecommunication network. The room 10 is equipped with a raised floor (also known as access floor, false floor or double floor) construction 14 having a modular support structure 16 defining a grid of modules for supporting floor tile elements 18. The raised floor 14 divides the room into a plenum space 17 underneath the raised floor 14 and a usable space 19 above the raised floor 14. An air conditioning device 20 of any suitable type known per se, e.g. of the CCAC (close control air conditioning) type, is installed in the room 10 adjacent a side wall. The air conditioning device 20 is arranged to receive a flow of hot air indicated at arrow 22, at an intake, to cool down the hot airflow and to feed a resulting flow of cooled air, indicated at arrows 24, to the plenum space 17. Besides providing a space for building elements (e.g. cabling, conduits, etc.), the raised floor 14 hence provides a passage for cooled air by means of the plenum space 17. Although not shown in FIG. 1, a false ceiling may be used in the room 10 for guiding hot air to the air conditioning device 20.

As further seen in FIG. 1, a cooling module 30 is arranged as floor element of the raised floor 14, with its upper end level with the floor laterally of the equipment 12. To this effect, the base dimensions of the cooling module 30 comply with those of a standard floor tile to be used with the raised floor 14, as appears from FIG. 1. The cooling module 30 comprises a fan 32 for producing a forced flow of cooled air, indicated at arrow 34 from the plenum space 17 to the usable space 19. The flow of cooled air is received by one or more intakes of the equipment 12 so as to cool electronic components, e.g. processors or other integrated circuits, contained therein. In a manner known per se, the equipment possesses an internal forced ventilation system ensuring internal airflow from the intakes to the outlets as indicated at arrow 36. Air that has been heated by the thermal dissipation of the electronic components exits the equipment 12 and is at least partially returned to the air conditioning device 20 according to arrow 22, so as to define a closed-cycle air recirculation. The function of a set of temperature sensors 40, 40' shown in FIG. 1, which are associated to the equipment 12 and connected to the cooling module 30, will be detailed below. As is apparent from FIG. 1, using the raised floor construction 14, the cooling module 30 together with the air conditioning device 20 forms an efficient cooling system for cooling the equipment 12 in the room 10.

Figure 2:
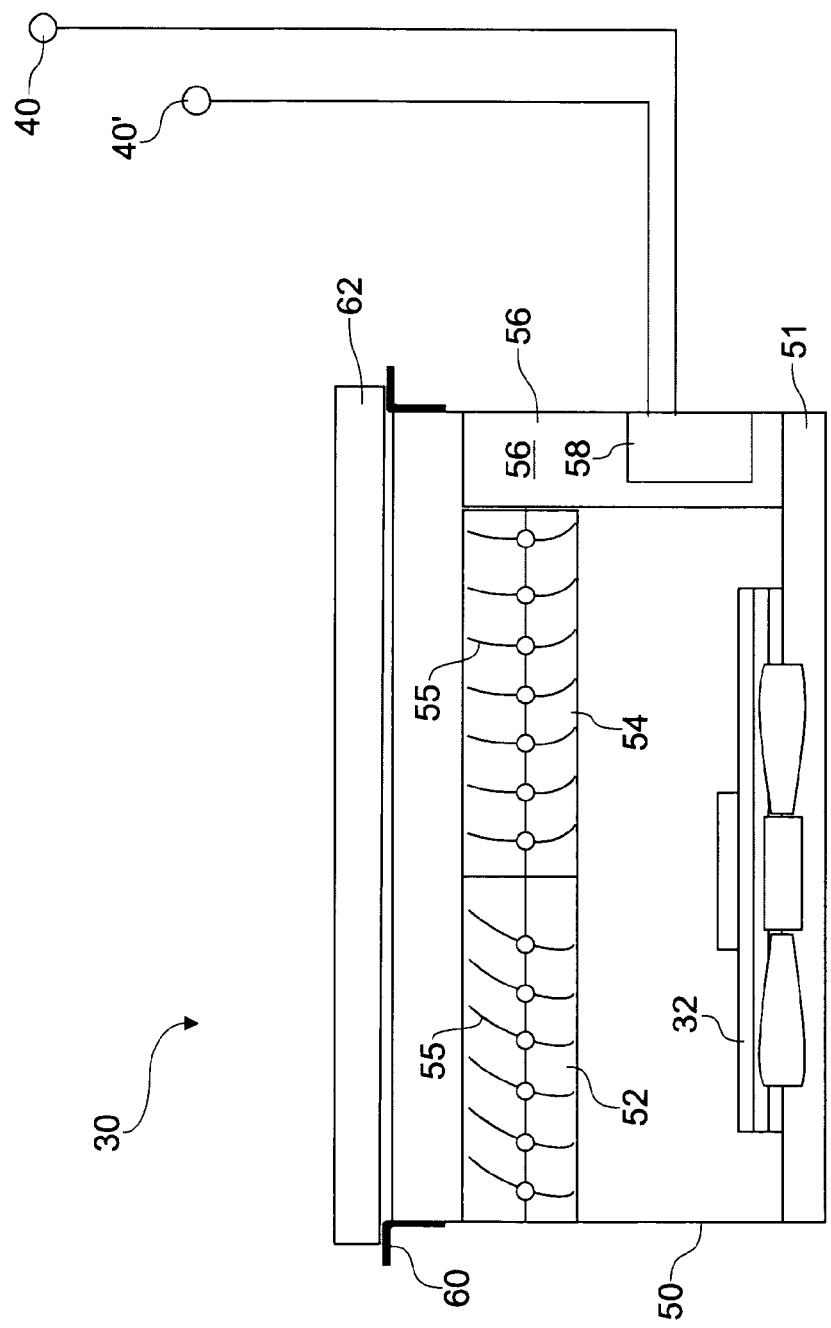
FIG. 2: is a schematic cross-section showing a cooling module used in the cooling system according to FIG. 1.

FIG. 2 shows the cooling module 30 in more detail. It comprises a housing 50 for containing its components. The fan 32 is of the axial type and arranged in a lower portion of the housing 50 adjacent an aspiration grille 51 which forms the bottom of the cooling module 30. The fan 32 is preferably driven by an EC (Electronically Commutated, i.e. brushless) DC motor, ensuring among others energy efficiency, quiet operation, comfortable controllability and increased reliability of operation. Use of an EC electrical motor allows reducing the power consumption significantly. In the configuration shown in FIG. 2, the cooling module 30 comprises two adjustable deflector units 52, 54 arranged side by side downstream, i.e. above, the fan 32. As seen in FIG. 2, the deflector units 52, 54 are arranged in an upper portion of the housing 50, above the fan 32. The deflector units 52, 54 are designed for deviating the forced flow of cooled air produced by the fan 32 and hence allow feeding cooled air to critical regions in the usable space 19 where cooling is required. As will be appreciated, the deflector units 52, 54 allow dynamic and automatic control of the flow direction of the flow of cooled air exiting the cooling module 30 while using a simple standard type fan 32. In case at least two deflector units 52, 54 are installed downstream the fan 32 as in FIG. 2, each deflector unit is configured to be independently adjustable so as to enable division of the flow produced by fan 32 into at least two corresponding partial flows, as will be detailed below. As seen in FIG. 2, each deflector unit 52, 54 comprises a set of collectively adjustable parallel blades 55 pivotably arranged within a support frame. As will be understood, the inclination of the blades 55 determines the flow direction of the respective partial flow exiting the respective deflector unit 52, 54. The blades 55 have a curved cross-section designed for minimum flow resistance and optimum flow deviation. As seen from FIG. 2, the blades 55 are arranged for preferring a flow direction towards one half space above the cooling module 30, since the latter is normally installed laterally of and associated to one specific item of equipment 12. Other arrangements of the blades 55 are however possible according to the circumstances and equipment configuration in the room 10.

FIG. 2 also schematically shows an electrical control panel 56 mounted integrally with the housing 50 and including a control device 58, such as a microprocessor. Among others, the control panel 56 provides power supply for the fan 32 and for respective actuators (not shown) of the adjustable deflector units 52, 54. The deflector units 52, 54 are connected to the control device 58 for automatic adjustment of the deflector units 52, 54. It will be understood that the combination of adjustable deflector units 52, 54 and the control device 58 enables automatic and targeted control of the flow direction of the flow of cooled air 34 exiting the cooling module 30. The temperature sensors 40, 40' located in different zones of the usable space 19 are also connected to the control device 58. The sensors 40, 40' deliver measurement signals to the control device 58 for controlling the flow direction in accordance with any suitable control algorithm known in the art, generally aiming to drive the temperature at the location of the respective sensor 40, 40' towards a desired set point. To this effect the control device 58 comprises a microprocessor or similar unit running a suitable control software. Furthermore, the control device 58 is arranged for controlling the performance of the EC type fan 32 so as to control the flow rate of cooled air (indicated at 34 in FIG. 1). This allows adapting the output of cooled air according to the actual thermal load, whereby savings in power consumption of the fan 32 and in particular of the air conditioning device 20 can be achieved when no or little cooling is required. It will be appreciated that the fan 32 enables independent flow rate adjustment at the level of each cooling module 30.

As further seen in FIG. 2, the housing 50 comprises at its upper end a circumferential mounting frame 60 used for installing the cooling module 30 as an element of the raised floor 14 in any module of the modular support structure 16. As seen in FIG. 1, the housing 50 is dimensioned according to a standard size, i.e. has the base dimensions of a floor tile element 18, so as to allow installation in a manner similar to the installation of a floor tile (see reference 18 in FIG. 1). As further seen in FIG. 1, the height of the housing 50 complies with that of the raised floor 14. Accordingly, flexibility of location and ease of installation of the cooling module 30 is warranted. Where required, a floor grille 62 may be placed on top of the mounting frame 60 so as to protect the cooling unit 30 and to avoid restriction of personnel mobility on the raised floor 14 above the cooling module 30. The floor grille 62 is designed for minimum flow resistance and minimum directional flow preference.

An item of electronic data processing equipment 12 is in most cases configured as a server rack. As regards commercially available racks and their internal cooling architecture, generally two different types can be distinguished, namely the horizontal flow and the vertical flow architecture.

Figure 3:
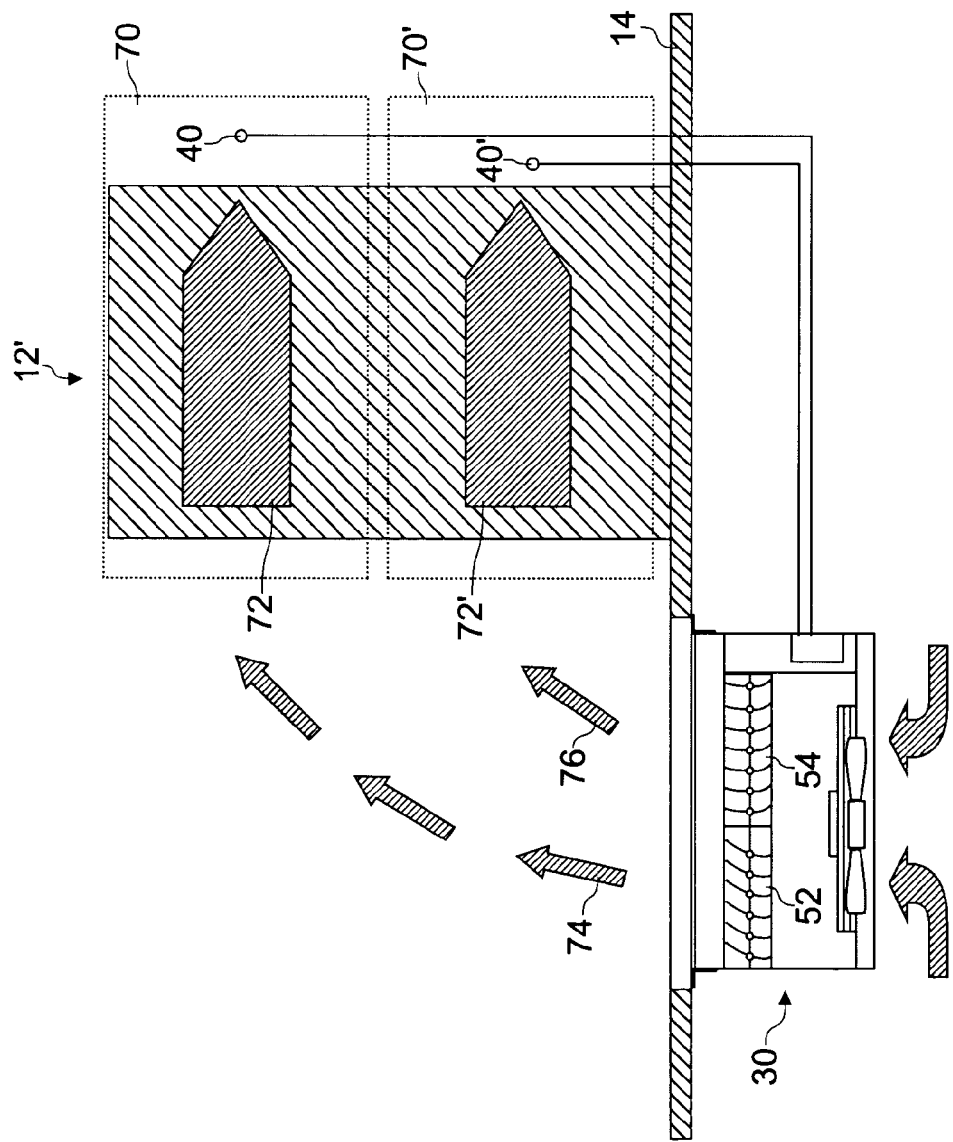
FIG. 3: is a schematic cross-section showing the cooling module according to FIG. 2 installed next to an equipment rack which is arranged for horizontal flow of cooling air.

FIG. 3 shows schematically shows an example of a rack 12' with horizontal flow architecture. As regards internal cooling, the rack 12' is divided into two zones an upper zone 70 and a lower zone 70'. Each zone is provided with a separate intake for cooled air on the rear side of the rack 12' and a separate outlet for heated air on the front side of the rack. Internal fans (not shown) ensure suction of air from the rear side to the front side in each zone as shown by arrows 72 and 72' respectively in FIG. 3. The cooling module 30 is arranged as floor element of the raised floor 14 laterally in proximity of the rack 12'. The adjustable deflector units 52, 54 allow selectively feeding cooled air to the respective intake of each zone 70, 70' of the rack 12'. The actual thermal load is measured by the temperature sensors 40, 40' associated to each outlet of the respective zones 70, 70', and communicated to the control device 58 of the cooling module 30. As will be appreciated, by virtue of the two independently adjustable deflector units 52, 54, the flow direction of each corresponding partial flow of cooled air exiting the cooling module 30, indicated at arrows 74 and 76, is independently adjustable. Therefore, the cooling module 30 enables distributing cooled air to a given zone 70, 70' of the server 12' according to the actual cooling requirements of the rack 12' which are determined by the control device 58 based on temperature measurements by the sensors 40, 40'. If for example electronic components in the lower zone 70' dissipate more heat than the components in the upper zone 70, the control device 58 deviates both the partial flow of one deflector unit 54 and part of or all of the partial flow of the other deflector unit 52, which was previously directed to the upper zone 70, towards the lower zone 70'. Hence, the cooling module 30 is capable of adapting automatically to varying cooling requirements within the rack 12'.

FIG. 3 shows schematically shows an example of a rack 12'' with vertical flow architecture. As regards internal cooling, the rack 12'' comprises an intake 80 arranged in the lower part of the rack 12'', e.g. on the rear side, and one or more outlets 82 arranged in the upper part of the rack, e.g. on both rear and front sides. Internal fans (not shown) ensure suction of air received via the intake 80 from the lower part vertically upwards to the upper part, as indicated by arrow 84, from where it is expelled via the outlets 82. As further seen in FIG.

3, the cooling module 30 is arranged underneath the raised floor 14 laterally of the rack 12" and in proximity of the intake 80. The adjustable deflector units 52, 54 allow directing the flow of cooled air directly towards the intake 80 as indicated by arrows 86. It will be understood that the cooling module 30 can also be used for cooling any other type of rack having an internal cooling architecture differing from those described above or any other type of equipment that requires airflow cooling.

Figure 4:
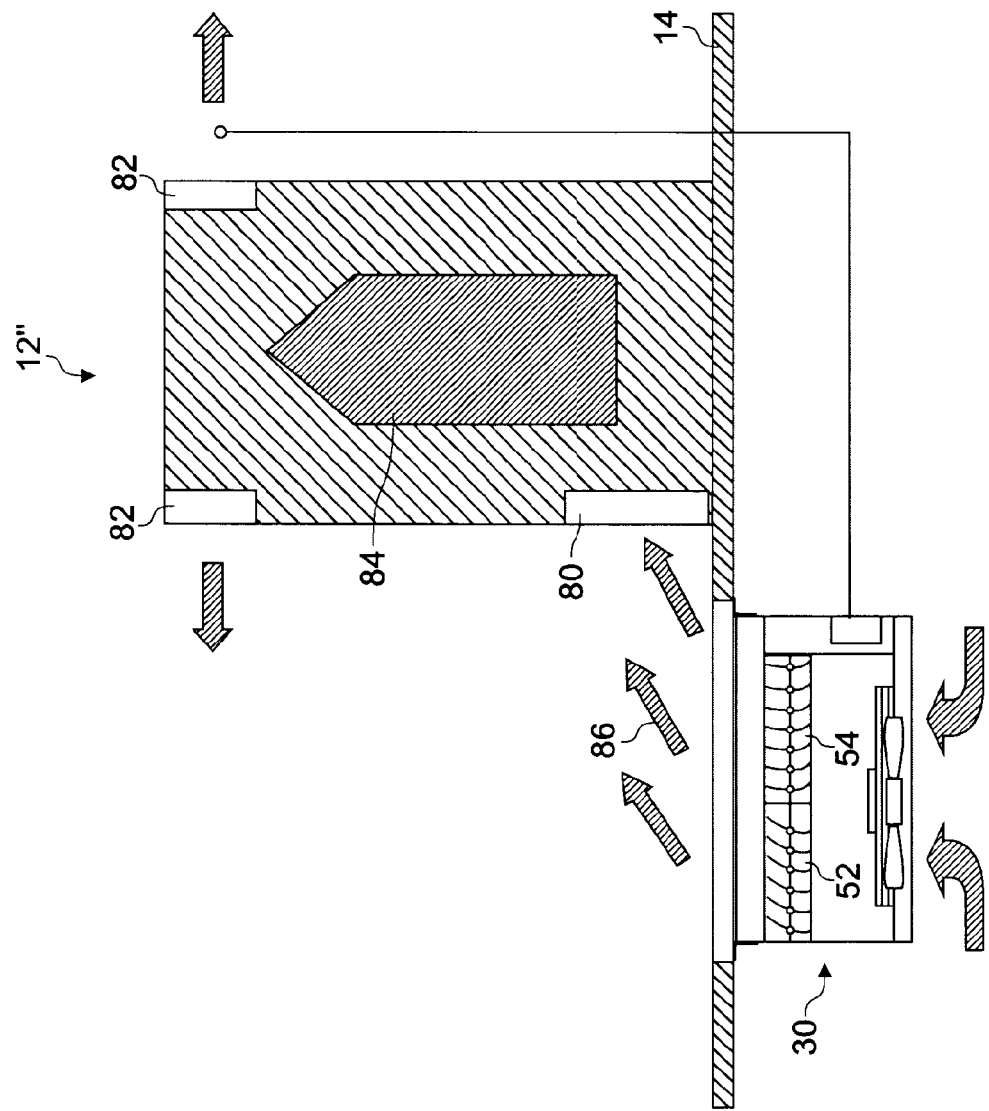
FIG. 4: is a schematic cross-section showing the cooling module according to FIG. 2 installed next to an equipment rack which is arranged for vertical flow of cooling air.

With airflow cooled equipment according to prior art cooling systems, the supply of cooled air is normally not directly connected or directed to the intakes of the equipment. Therefore, cooled air typically represents only a fraction of the total airflow entering at the intake of the rack and used for internal cooling. This is firstly because of limited flow rates of prior art cooling devices and secondly because of natural convection producing recirculation of ambient room air and more specifically recirculation of hot air originating from the outlet(s) of the equipment. Therefore, the air temperature at the equipment intakes is normally undesirably higher than that of the cooled air provided by the cooling system. It will therefore be appreciated, that for both configurations of FIG. 3 and FIG. 4 the cooling module 30 enables reducing intake temperature and recirculation of hot air (from an outlet to an intake) for a given rack 12', 12". This can be automatically achieved by having the control device 58 produce a partial flow directed towards the intake(s) and/or so as to diminish the effect of undesirable recirculation. As will further be understood by the skilled person, the fan 32 dedicated to the cooling module 30 allows selective adjustment of the flow rate of cool air to be delivered to the region that requires cooling.

It will be understood that the actual number of adjustable deflector units (e.g. 52, 54) used in a cooling module 30 according to the invention is depending on given installation and environment requirements of the equipment 12, 12', 12" and the room 10. Hence any number of one, two or more deflector units can be included in the cooling module 30. Furthermore, although cooling on a single item of equipment 12, 12', 12" by means of a single cooling module 30 has been described for the purposes of simplification, it will be understood, that such a room 10 generally comprises a plurality of items of equipment 12, 12', 12" (e.g. arranged in several parallel rows) which will be equipped with a suitable number of cooling modules 30, e.g. one or two per item. In this respect it may be noted, that a given cooling module 30 and its control device 58 is capable of acting as master control for adjusting its own deflector unit(s) 52, 54 as well as the deflector unit(s) 52, 54 of one or more additional cooling modules (not shown) arranged adjacent the given cooling module 30 and for example associated to the same item of equipment 12, 12', 12". Alternatively, a plurality of cooling modules 30 can be connected to an external centralized control system that monitors and regulates the room and equipment temperatures.

As appears from a comparison of FIG. 2 and FIG. 3, the cooling module is compatible with different equipment designs and capable of automatically adapting to the actual cooling needs thereof.

FIG. 5 and FIG. 6 schematically show a room 100 which contains electronic data processing equipment arranged in racks 12' of the type described hereinabove in relation to FIG. 3 (horizontal flow architecture). Together with two adjacent rows 87, 89 of racks 12', vertical partition walls 90 (see FIG. 6), arranged laterally, in combination with a horizontal upper partition wall 92 (see FIG. 5), arranged in the manner of a roof, delimit a space that defines a cold air region 94 in between the two rows 87, 89 of racks 12'. The cold air region 94 is supplied with cooled air by means of a plurality of cooling modules 30 as shown in FIG. 1, each of which is associated to a specific adjacent rack 12'. At least one of the vertical partition walls 90 (see FIG. 5) is provided with access doors, to allow access to the front side of the racks 12' located inside the space delimited by partition walls 90, 92 and racks 12'. The internal cooling systems of the racks 12' transfer the heat dissipated by the processing equipment to cold air drawn from the cold air region 94 and subsequently blow the resulting heated air into hot air regions 96 on the rear side of the racks 12'. It will be appreciated, that the partition wall system shown in FIG. 5 and FIG. 6 eliminates the risk of hot air recirculation described hereinabove. The system of partition walls 90, 92 is compatible with other types of rack design (e.g. that of FIG. 4). It will further be understood, that a plurality of pairs of rows 87, 89, can be arranged in a single room so as to form cold and hot aisles in alternating fashion between adjacent rows of racks. In combination with the cooling module 30 of FIG. 1, the partition wall system illustrated in FIG. 5 and FIG. 6 provides a further improvement in overall efficiency and reliability of the cooling system.

Finally, several further advantages of the cooling system and its cooling modules according the invention should be noted:

- overall energy consumption for cooling is reduced by virtue of well targeted and well proportioned cooling of the equipment according to the actual thermal load (airflow regulated in function of actual demand);
- achievable airflow rate matches the requirement of a typical server rack at full load;
- installation of the cooling system, in particular the cooling modules, can be readily carried out in new and in existing rooms (upgrading);
- the cooling system can be rapidly adapted to modifications in positioning and amount of the equipment in the room, by adding, removing or displacing the cooling modules as required;
- reliability is warranted by using a mechanically simple and reliable device for controlling flow direction. Furthermore, in case of a failure of a fan, controlling flow direction by means of the deflector unit(s) is still possible taking advantage of natural convection and of the remaining ventilation elements within the equipment and/or the air conditioning device;
- potential downtime is short since a cooling module can be replaced very rapidly;
- by virtue of at least two deflector units in a cooling module, it is possible to achieve adaptive cooling with respect to internal requirements of a single item of equipment, i.e. directing one or more (partial) flow(s) of cooled air to the zone(s) subject to more pronounced thermal load inside a single item of equipment;
- a modular standard size construction of the cooling module allows it to be simply and quickly installed in existing and new standard modular raised floors;
- the cooling system is self-adapting and fully automatic by sensing the current thermal load and controlling both flow direction and flow rate, hence user interventions are significantly reduced if not eliminated;
- by virtue of controlled deflector units, the cooling system automatically adapts to changes in internal configuration of a given item of equipment;
- by connecting the control panels to a suitable network, measured temperatures and the operating status of the cooling system can be conveniently monitored;

maintenance procedures on the modules are comfortable due to the integration of components into a single easily removable module;

working comfort of equipment maintenance personnel is assured since the cooling modules do not impede their mobility;

intake air temperature for the equipment is reduced by directing cooled air in a targeted manner to the respective intake and by reducing the effect of hot air recirculation, a significant increase in cooling efficiency is thereby achieved;

flow rate control from zero (convection) to maximum flow rate enables adjustment of the cooling capacity delivered the region to which a given cooling module is affected whereby overall energy consumption for cooling is optimized.

The invention claimed is:

1. A cooling system for a room containing electronic data processing equipment that is arranged in racks, said system comprising:
   a raised floor construction dividing said room into a plenum space underneath said raised floor and a usable space above said raised floor;
   an air conditioning device for feeding cooled air to said plenum space;
   a cooling module arranged as a floor element of said raised floor, said cooling module comprising:
      a fan for providing a flow of cooled air from said plenum space to said usable space;
      at least two deflector units arranged side by side adjacent a first side of a rack and downstream of said fan for deviating the flow of cooled air provided by said fan such that the flow direction of said flow is controllable towards both an upper zone and a lower zone of a rack, each deflector unit being independently adjustable so as to enable division of said flow into at least two corresponding and simultaneous partial flows of independently adjustable flow direction, wherein each deflector unit includes a set of collectively adjustable parallel blades pivotably arranged within a support frame and having a curved cross-section, said blades configured for deviating the flow of cooled air provided by said fan by inclination of said blades and for preferring a flow direction towards said upper zone or said lower zone of said rack;
   a control device connected to the deflector units of said cooling module for automatically controlling the flow direction of said partial flows by adjustment of said deflector units, wherein said control device is arranged for independently adjusting each of said deflector units so as to control the flow direction of each of said partial flows.

2. The cooling system according to claim 1, wherein said cooling module comprises a housing which contains, in a lower portion of said housing, said fan and, in an upper portion of said housing, said at least two deflector units.

3. The cooling system according to claim 2, wherein said raised floor comprises a support structure and wherein said housing is suspended in said support structure.

4. The cooling system according to claim 3, wherein said control device is arranged in said housing.

5. The cooling system according to claim 1, further comprising at least one temperature sensor arranged in said usable space and connected to said control device, wherein said control device is configured for determining cooling requirements in said usable space based on measurements by said temperature sensor and for adjusting said deflector units in accordance with the determined requirements.

6. The cooling system according to claim 5, wherein said temperature sensor is arranged in the region of hot air outflow of an item of electronic data processing equipment installed on said raised floor, and wherein said control device is configured for determining the cooling requirements of said item of electronic data processing equipment based on measurements by said temperature sensor.

7. The cooling system according to claim 6, wherein said fan is speed variable and said control device is configured for controlling both the flow directions of said partial flows of cooled air by adjusting said deflector units and the flow rate of cooled air by controlling the performance of said fan.

8. The cooling system according to claim 1, comprising a first cooling module and at least a second cooling module, said cooling modules being associated to an item of electronic data processing equipment installed on said raised floor, wherein the first cooling module comprises a control device arranged to act as master control for adjusting both the deflector units of said first cooling module and the deflector units of at least said second cooling module.

9. The cooling system according to claims 1, wherein said raised floor has a modular configuration comprising a modular support structure and wherein said cooling module comprises a mounting frame designed to be received in any module of said modular support structure.

10. The cooling system according to claim 1, further comprising a plurality of cooling modules, each cooling module being associated, individually or in a group, to one particular item of electronic data processing equipment of a plurality of items of electronic data processing equipment.

11. A cooling module for cooling electronic data processing equipment arranged in a rack, said cooling module being adapted to be arranged as a floor element of a raised floor, said cooling module comprising:
   a fan for providing a flow of cooled air to a space above said cooling module;
   at least two deflector units arranged side by side adjacent a first side of a rack and downstream of said fan for deviating the flow of cooled air provided by said fan, each deflector unit being independently adjustable so as to enable division of said flow into at least two corresponding and simultaneous partial flows of independently adjustable flow direction such that the flow direction of said partial flows is controllable towards both an upper zone and a lower zone of a rack, wherein each deflector unit includes a set of collectively adjustable parallel blades pivotably arranged within a support frame and having a curved cross-section, said blades configured for deviating the flow of cooled air provided by said fan by inclination of said blades; and
   a control device for automatically controlling the flow direction of said partial flows, said deflector units being connected to said control device for automatic adjustment of said deflector units.

12. The cooling module according to claim 11 further comprising a housing which contains, in a lower portion of said housing, said fan and, in an upper portion of said housing, said deflector units.

13. The cooling module according to claim 11 further comprising a mounting frame designed to be received in any module of a modular support structure of a raised floor construction.

14. The cooling module according to claim 11, wherein said fan is speed variable and said control device is configured for controlling the flow directions of said partial flows by adjusting said deflector units and for controlling the flow rate of cooled air by controlling the performance of said fan.

15. The cooling module according to claim 11, wherein each deflector unit comprises a set of collectively adjustable parallel blades, said blades having a preferred flow direction towards said upper zone or said lower zone of said rack.

16. A cooling module for cooling electronic data processing equipment arranged in a rack, said cooling module comprising:
- a mounting frame designed to be received in a modular support structure of a raised floor construction;
- a fan for providing a flow of cooled air to a space above said cooling module,
- at least one adjustable deflector unit arranged downstream of said fan and comprising a set of collectively adjustable parallel blades pivotably arranged within a support frame and having a curved cross-section for deviating the flow of cooled air provided by said fan by inclination of said blades such that the flow direction of said flow is controllable towards both an upper zone and a lower zone of a rack, wherein said cooling module comprises at least two deflector units arranged side by side adjacent a first side of a rack and downstream of said fan for deviating the flow of cooled air provided by said fan, each deflector unit being independently adjustable so as to enable division of said flow into at least two corresponding and simultaneous partial flows of independently adjustable flow direction said deflector units being connected to said control device for automatic adjustment of said deflector units; and
- a control device connected to said deflector unit for automatically controlling the flow direction of said flow by pivotal adjustment of said blades, said control device being arranged for independently adjusting each of said deflector units so as to control the flow direction of each of said partial flows.

17. The cooling module according to claim 16, wherein said fan is speed variable and said control device is configured for controlling the flow directions of said partial flows by adjusting said deflector units and for controlling the flow rate of cooled air by controlling the performance of said fan.

18. The cooling module according to claim 16 further comprising a housing which contains, in a lower portion of said housing, said fan and, in an upper portion of said housing, said deflector units.

19. The cooling module according to claim 16, wherein said deflector unit comprises a set of collectively adjustable parallel blades, said blades having a preferred flow direction towards said upper zone or said lower zone of said rack.

* * * * *